(12) United States Patent
Zhao et al.

(10) Patent No.: US 11,515,490 B2
(45) Date of Patent: Nov. 29, 2022

(54) ORGANIC LIGHT-EMITTING COMPOSITE MATERIAL AND AN ORGANIC LIGHT-EMITTING DEVICE COMPRISING THE SAME

(71) Applicant: JIANGSU SUNERA TECHNOLOGY CO., LTD., Wuxi (CN)

(72) Inventors: Xindong Zhao, Wuxi (CN); Zhaochao Zhang, Wuxi (CN); Chong Li, Wuxi (CN); Lichun Wang, Wuxi (CN)

(73) Assignee: JIANGSU SUNERA TECHNOLOGY CO., LTD., Wuxi (CN)

( * ) Notice: Subject to any disclaimer, the term of this patent is extended or adjusted under 35 U.S.C. 154(b) by 198 days.

(21) Appl. No.: 16/907,292

(22) Filed: Jun. 21, 2020

(65) Prior Publication Data

US 2020/0321539 A1 Oct. 8, 2020

Related U.S. Application Data

(63) Continuation of application No. PCT/CN2018/123294, filed on Dec. 25, 2018.

(30) Foreign Application Priority Data

Dec. 29, 2017 (CN) .......................... 201711477322.5

(51) Int. Cl.
*H01L 51/00* (2006.01)
*H01L 51/42* (2006.01)
*H01L 51/50* (2006.01)

(52) U.S. Cl.
CPC ........ *H01L 51/0072* (2013.01); *H01L 51/006* (2013.01); *H01L 51/0061* (2013.01);
(Continued)

(58) Field of Classification Search
CPC ............... H01L 51/0072; H01L 51/006; H01L 51/0061; H01L 51/0067; H01L 51/0085;
(Continued)

(56) References Cited

U.S. PATENT DOCUMENTS

2016/0164020 A1* 6/2016 Kim ........................ C09K 11/06
257/40
2017/0309687 A1* 10/2017 Watabe ................. H01L 27/322
(Continued)

FOREIGN PATENT DOCUMENTS

CN     105503766 A    4/2016
CN     105895811 A    8/2016
(Continued)

OTHER PUBLICATIONS

Internation Search Report of PCT/CN2018/123294, dated Mar. 26, 2019.

*Primary Examiner* — Mamadou L Diallo
(74) *Attorney, Agent, or Firm* — True Shepherd LLC; Andrew C. Cheng

(57) ABSTRACT

An objective of the disclosure is to provide an organic light-emitting composite material based on an exciplex, which, when used as a light-emitting layer, can enhance the efficiency of an organic electroluminescent device. The disclosure also relates to an organic light-emitting device comprising the organic light-emitting composite material, and use of the organic light-emitting composite material of the disclosure for an organic electron device.

20 Claims, 1 Drawing Sheet

(52) U.S. Cl.
CPC ...... *H01L 51/0067* (2013.01); *H01L 51/0085* (2013.01); *H01L 51/0058* (2013.01); *H01L 51/0074* (2013.01); *H01L 51/42* (2013.01); *H01L 51/5004* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/552* (2013.01)

(58) Field of Classification Search
CPC . H01L 51/0058; H01L 51/0074; H01L 51/42; H01L 51/5004; H01L 51/5016; H01L 51/5056; H01L 51/5072; H01L 51/5088; H01L 51/5092; H01L 51/5096; H01L 2251/552; H01L 51/0059; H01L 2251/5384; H01L 51/5024; C09K 2211/1007; C09K 2211/1014; C09K 2211/1029; C09K 2211/1092; C09K 11/06; Y02E 10/549
See application file for complete search history.

(56) References Cited

U.S. PATENT DOCUMENTS

| | | | | |
|---|---|---|---|---|
| 2018/0375053 | A1* | 12/2018 | Duan | H01L 51/5016 |
| 2019/0019971 | A1* | 1/2019 | Xie | C09K 11/06 |
| 2019/0036033 | A1* | 1/2019 | Nakanotani | H01L 51/0067 |
| 2019/0378991 | A1* | 12/2019 | Pan | C07D 251/24 |
| 2020/0083460 | A1* | 3/2020 | Duan | C09K 11/06 |
| 2020/0083461 | A1* | 3/2020 | Duan | C07D 513/04 |
| 2020/0119299 | A1* | 4/2020 | Hong | H01L 51/5012 |
| 2020/0136059 | A1* | 4/2020 | Hong | H01L 51/0072 |
| 2020/0350508 | A1* | 11/2020 | Seo | H01L 51/5024 |

FOREIGN PATENT DOCUMENTS

| | | | | |
|---|---|---|---|---|
| CN | 106206974 | A | 12/2016 | |
| CN | 106531897 | A | 3/2017 | |
| CN | 107492596 | A * | 12/2017 | ............ C09K 11/06 |
| CN | 107492596 | A | 12/2017 | |

* cited by examiner

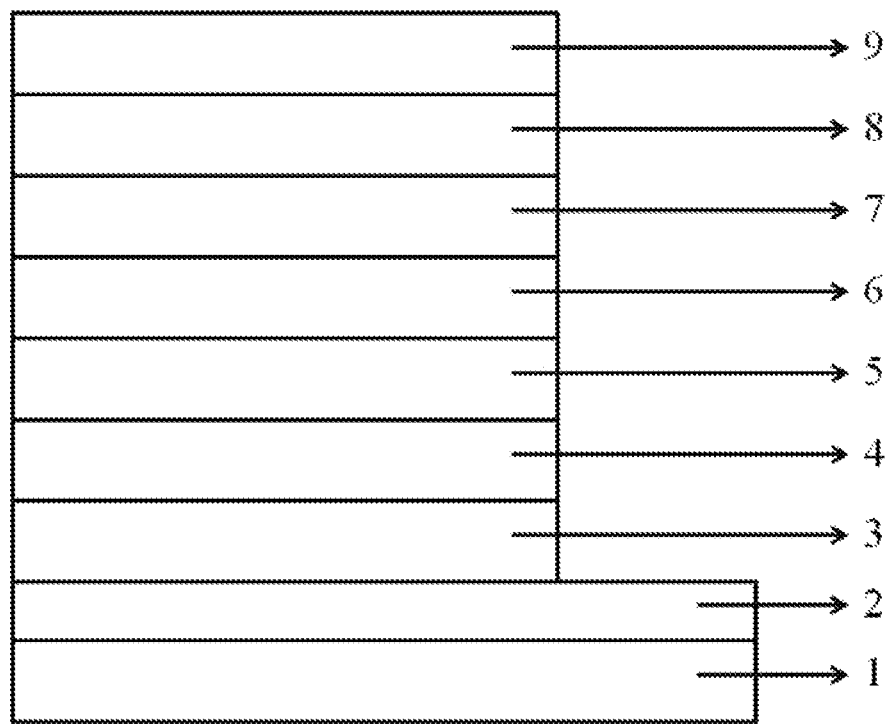

ORGANIC LIGHT-EMITTING COMPOSITE MATERIAL AND AN ORGANIC LIGHT-EMITTING DEVICE COMPRISING THE SAME

CROSS-REFERENCE TO RELATED APPLICATIONS

This application is a continuation of International Patent Application No. PCT/CN2018/123294 with a filing date of Dec. 25, 2018, designating the United States, and claims priority to Chinese Patent Application No. 201711477322.5 with a filing date of Dec. 29, 2017. The content of the aforementioned applications, including any intervening amendments thereto, are incorporated herein by reference.

TECHNICAL FIELD

The disclosure relates to an organic light-emitting composite material based on an exciplex. Particularly, the disclosure relates to an organic composite material comprising an exciplex as a host material and an organic light-emitting material having a thermal activation delayed fluorescence effect as a dopant material. The disclosure also relates to an organic light-emitting device comprising the organic light-emitting composite material, and use of the organic light-emitting composite material of the disclosure for an organic electron device.

BACKGROUND

An "organic light-emitting phenomenon" is a phenomenon for converting electric energy into light energy utilizing an organic material. The principle of the organic light-emitting phenomenon is that when the organic material layer is placed between an anode and a cathode, if a voltage is applied to a specific organic molecule through two electrodes, electrons from the cathode and the holes from anode together flow into the organic material layer to form exciplexes, and these exciplexes transit back to a ground state and emit light.

The organic light-emitting device (OLED) is an organic light-emitting device utilizing the organic light-emitting phenomenon. Its structure generally includes the anode, the cathode and the organic material layer inserted between them. In the organic light-emitting device having the structure, when the voltage is applied between two electrodes, holes from the anode and the electrons from the cathode are injected into the organic material layer, the holes and the electrons that are injected are combined with each other to form the exciplexes, and then the exciplexes can emit light when descending to the ground state. The organic material has the advantages of low synthesis cost, adjustable function, good flexibility and good film forming property. Furthermore, devices based on the organic material typically are simple in manufacturing process, easy to manufacture in large area and environmental friendly, can adopt a film preparation method where operation temperature is relatively low, and therefore has the advantage of low manufacturing cost, has huge application potential, and had been widely focused by domestic and overseas scholars in the past 20 years.

In recent years, the organic light-emitting material based on the exciplex has become a research hotspot, because the device based on the exciplex is simple in structure and low in drive voltage. Regardless of phosphorescence or fluorescence, its theoretical quantum efficiency can reach 100%.

Chinese patent application CN106531897A describes an organic electroluminescent device based on an exciplex. The light-emitting layer of the device is formed by mixing a hole transport material, an electron transport material and a fluorescent light-emitting material or phosphorescent light-emitting material. The hole transport material and the electron transport material form the exciplex. Where, 4-(9,9-dimethyl-9H-fluorene-2-yl)-N,N-diphenylaniline (TPAF) is used as the hole transport material, and 4,6-bis(3,5-di-3-pyridylphenyl)-2-methylpyrimidine and 4,6-bis(3,5-di(pyridine-3-yl)phenyl)-2-methylpyridine are used as the electron transport materials. However, the present application does not involve a relationship between energy levels of the exciplex materials or a relationship between energy levels of the exciplex materials and other dopant materials.

The novel fluorescence light-emitting material having the thermal activation delayed fluorescence (TADF) effect characteristic had obtained wide attention in the application of high-efficiency organic light-emitting device in the past years. Since it has an extremely small singlet-triplet energy gap ($\Delta E_{ST}$), the TADF light-emitting material can realize effective reverse intersystem crossing (RISC) so as to be converted from triplet state ($T_1$) to singlet state ($S_1$), thereby collecting non-radiation triplet exciplexes for emitting light. Thus, the organic light-emitting device based on the TADF light-emitting material can theoretically realize 100% internal quantum efficiency without using the phosphorescence emitting material, thereby improving the efficiency and stability of the organic light-emitting device.

Chinese patent application CN105503766A describes the TADF material based on closed sulfoxide or carbonyl groups and an organic electroluminescent device comprising the same. This patent obtains an organic light-emitting device having both improved efficiency and stability, and manufacturing cost is low in cost. However, the patent does not involve the use of the exciplex, or the relationship between energy levels of the TADF material.

At present, there is still a need to develop a new material having more excellent property for the organic light-emitting device.

SUMMARY

An objective of the disclosure is to provide an organic light-emitting composite material, which can improve the efficiency of an organic electroluminescent device as a light-emitting layer.

Provided is an organic light-emitting composite material, comprising a host material and a dopant material, the host material being an exciplex formed by mixing at least one electron donor material and at least one electron acceptor material, the dopant material being at least one organic light-emitting material having a thermal activation delayed fluorescence effect (TADF material), wherein, the absolute value of the HOMO (highest occupied molecular orbit) energy level of the electron donor material constituting the exciplex is less than the absolute value of the HOMO energy level of the electron acceptor material, and the difference range is no less than 0.2 eV, preferably more than 0.3 eV, the absolute value of the LUMO (lowest unoccupied molecular orbit) energy level of the electron donor material constituting the exciplex is less than the absolute value of the LUMO energy level of the electron acceptor material, and the difference range is no less than 0.2 eV, preferably more than 0.3 eV, the singlet ($S_1$) and triplet ($T_1$) energy levels of the electron donor material and the electron acceptor material which constitute the exciplex are both higher than the singlet ($S_1$) energy level of the organic light-emitting material having the thermal activation delayed fluorescence effect, and the difference is no less than 0.2 eV, the difference between singlet ($S_1$) and triplet ($T_1$) energy levels of the host material of the exciplex is no more than 0.15 eV, the triplet ($T_1$) energy level of the host material of the exciplex is more than that of the organic light-emitting material having the thermal activation delayed fluorescence effect, and the difference range is 0.1 eV or more, preferably no less than 0.2 eV, and the difference between singlet ($S_1$) and triplet ($T_1$) energy levels of the organic light-emitting material having the thermal activation delayed fluorescence effect is no more than 0.2 eV, preferably no more than 0.15 eV, and the light-emitting half-peak width is no more than 120 nm, preferably less than 100 nm.

In another aspect, the disclosure also relates to an organic light-emitting device comprising the organic light-emitting composite material, comprising a first electrode, a second electrode and a functional layer provided between the first electrode and the second electrode, wherein the functional layer comprises a light-emitting layer and optionally comprises a hole injection layer, a hole transport layer, an electron barrier layer and a hole barrier layer, an electron transport layer and an electron injection layer, and the organic light-emitting device also optionally comprises a substrate, wherein, the light-emitting layer is the organic light-emitting composite material of the disclosure as described above.

In another aspect, the disclosure also relates to use of the organic light-emitting composite material of the disclosure as described above for the organic electron device such as the organic light-emitting device and an organic solar battery.

The organic light-emitting device comprising the organic light-emitting composite material of the disclosure has the advantages of higher device efficiency, lower device voltage, high color purity and long service life.

BRIEF DESCRIPTION OF THE DRAWINGS

FIG. 1 is a diagram of an embodiment of an organic light-emitting device, wherein
1, substrate
2, anode
3, hole injection layer
4, hole transport layer
5, electron barrier layer
6, light-emitting layer
7, electron transport layer
8, electron injection layer
9, cathode

DESCRIPTION OF THE EMBODIMENTS

Hereinafter, embodiments shown in the specification will be described in detail.

In the context, without oppositely stated, all the operations are performed at room temperature and at normal pressure.

In the context of the disclosure, unless otherwise noted, HOMO means the highest occupied molecule orbit, and LUMO means the lowest unoccupied molecule orbit. In addition, "the difference of HOMO energy levels" and "the difference of LUMO energy levels" mean the difference of the absolute value of each energy value. In addition, in the context of the disclosure, the HOMO and LUMO energy levels are represented with the absolute values, and comparison between energy levels is comparison of absolute values. Those skilled in the art know that the large the absolute value of an energy level is, the lower the energy of the energy level is.

The HOMO energy level can be measured using UV photoelectron spectroscopy (UPS), wherein, UV light is irradiated onto the surface of a film, and the ionization potential of the material can be measured through detection of the emitted electrons. In addition, the HOMO energy level can be measured using cyclic voltammetry (CV), wherein, after a material to be detected is dissolved into a solvent having an electrolyte, oxidization potential is measured using voltage scanning.

The LUMO energy level can be obtained through inverse photoelectron energy spectroscopy (IPES) or by measuring electrochemical reduction potential. IPES is a method for determining LUMO energy level by irradiating electron beams to a film and measuring light generated at this moment. In addition, electrochemical reduction potential can be determined by measuring reduction potential with voltage scanning after the material to be detected is dissolved into the solvent having the electrolyte. In addition, LUMO energy level can be calculated using singlet energy level obtained by measuring the HOMO energy level and UV absorbance of a target material.

In the context of the disclosure, the energy level of the "the host material of the exciplex" means the energy level recombined after the exciplex is formed as a whole.

In the context of the disclosure, unless otherwise noted, the singlet ($S_1$) energy level refers to the lowest excited energy level of the singlet state of the molecule, while the triplet ($T_1$) energy level refers to the lowest excited energy level of the triplet state of the molecule. In addition, "the difference of the singlet energy level" and "the difference of the triplet energy level" and "the difference between the singlet and triplet energy levels" involved in this specification refer to the difference of the absolute value of each energy value. In addition, the difference between various energy levels is expressed with the absolute value. In addition, the singlet and triplet energy levels can be measured by fluorescence and phosphorescence spectrums respectively, which is well known to those skilled in the art.

In this specification, it should be understood that when it is mentioned that one element is placed "on" another element, it can be directly on the another element or an intermediate element is present between the two elements.

In this specification, it should be understood that when it is mentioned that one element is placed "between" the other two elements, it can be directly between two elements or there is an intermediate element is also present between this element and the other two elements.

In one aspect, the disclosure provides an organic light-emitting composite material, comprising a host material and a dopant material, the host material being an exciplex formed by mixing at least one electron donor material and at least one electron acceptor material, the dopant material being at least one organic light-emitting material having a thermal activation delayed fluorescence effect, wherein, the absolute value of the HOMO energy level of the electron donor material constituting the exciplex is less than the absolute value of the HOMO energy level of the electron acceptor material, and the difference range is no less than 0.2 eV, preferably more than 0.3 eV, the absolute value of the LUMO energy level of the electron donor material constituting the exciplex is less than the absolute value of the LUMO energy level of the electron acceptor material, and the difference range is no less than 0.2 eV, preferably more than 0.3 eV, the singlet and triplet energy levels of the electron donor material and the electron acceptor material which constitute the exciplex are both higher than the singlet energy level of the organic light-emitting material having the thermal activation delayed fluorescence effect, and the difference is no less than 0.2 eV, the difference between singlet and triplet energy levels of the host material of the exciplex is no more than 0.15 eV, the triplet energy level of the host material of the exciplex is more than that of the organic light-emitting material having the thermal activation delayed fluorescence effect, and the difference range is 0.1 eV or more, preferably no less than 0.2 eV, and the difference between singlet and triplet energy levels of the organic light-emitting material having the thermal activation delayed fluorescence effect is no more than 0.2 eV, preferably no more than 0.15 eV, and the full width at half maximum of the light-emitting is no more than 120 nm, preferably less than 100 nm.

The exciplex is formed of the electron donor material and the electron acceptor material. Relative to the single host material, the energy level of the exciplex can be redistributed, energy between the host and the guest is more sufficiently transferred, the device efficiency is correspondingly improved. Meanwhile, since the host material is composed of the donor material and the acceptor material, carriers are directly injected into the HOMO of the donor and the LUMO of the acceptor when in injection without a need of being injected into the HOMO and LUMO of the host like the traditional host material, and in such a way, the carriers are more easily injected, and the device voltage is lower.

In the disclosure, there is no special limitation for selection of the electron donor material and the electron acceptor material which constitute the exciplex as long as its HOMO and LUMO as well as singlet energy and triplet energy can meet the above conditions.

In a preferred embodiment, the electron donor material and the electron acceptor material which constitute the exciplex are selected from carbazole derivatives, triarylamine derivatives, fluorene derivatives, spirofluorene derivatives, triazine derivatives, nitrogen-containing heterocyclic derivatives and xanthone derivatives.

In a preferred embodiment, the electron donor material and the electron acceptor material which constitute the exciplex are selected from mCP, TPBi, TCTA, BmPyPb, NPB, PO-T2T, B3PYMPM and TAPC, and the structures are as follows respectively:

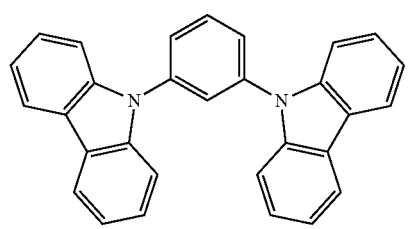

mCP

-continued

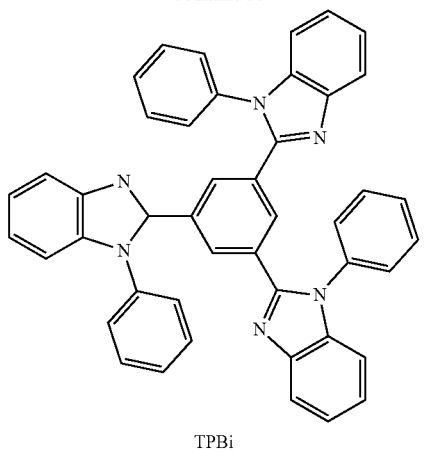

TPBi

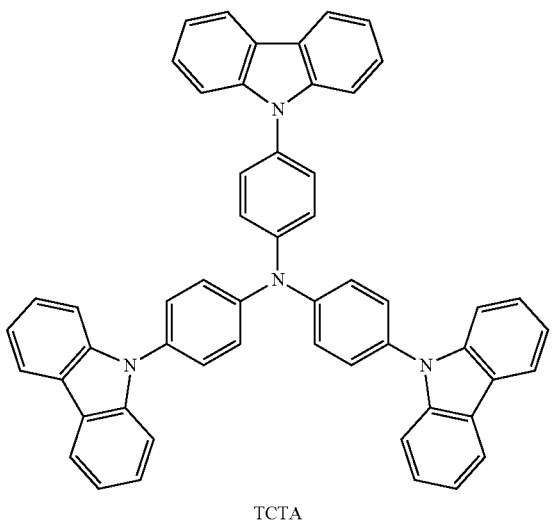

TCTA

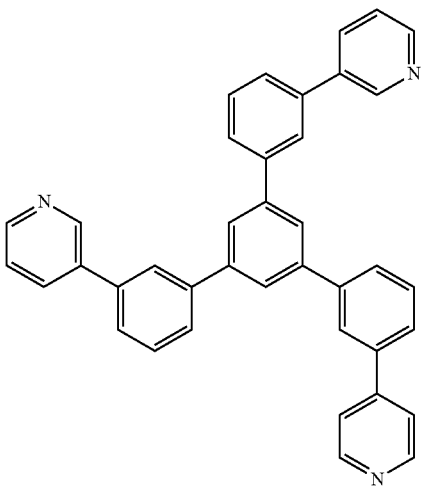

BmPyPb

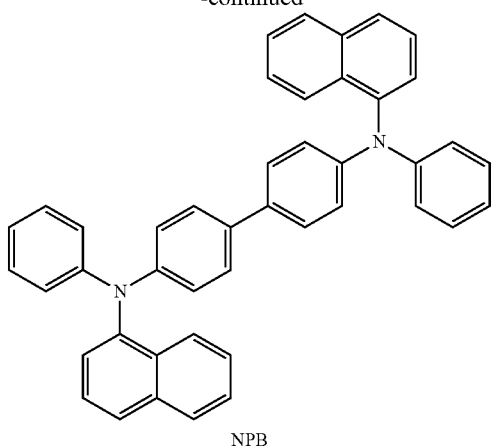

NPB

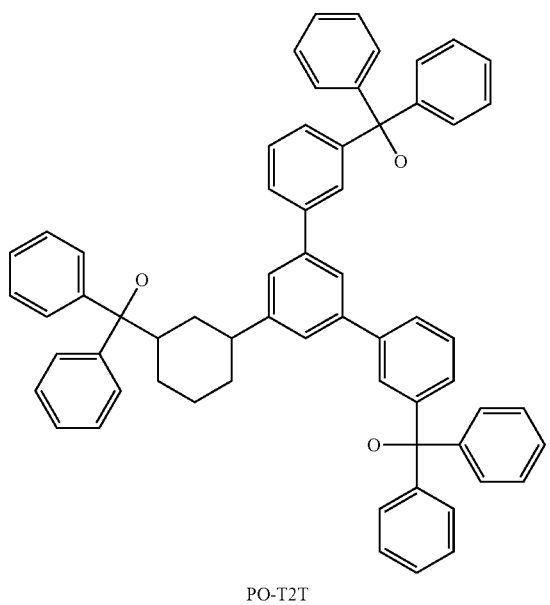

PO-T2T

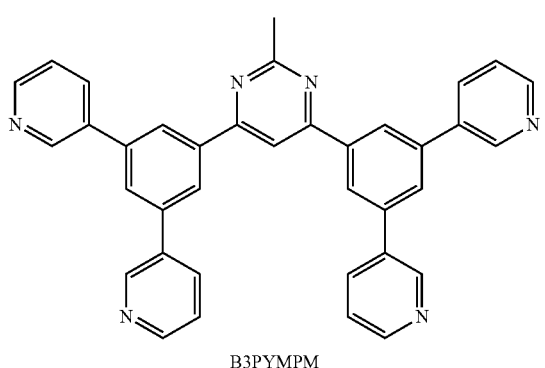

B3PYMPM

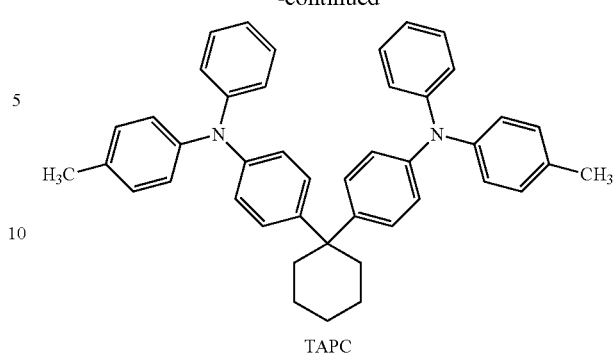

TAPC

In a preferred embodiment, the electron donor material constituting the exciplex is selected from mCP and TCTA.

In a preferred embodiment, the electron acceptor material constituting the exciplex is selected from PO-T2T and BmPyPb.

In a preferred embodiment, the electron donor material and the electron acceptor material which constitute the exciplex are mCP and PO-T2T, respectively.

In a preferred embodiment, the electron donor material and the electron acceptor material which constitute the exciplex are TCTA and BmPyPb, respectively.

There is no special limitation for the weight ratio of the electron donor material and the electron acceptor material which constitute the exciplex. In a preferred embodiment, for example, the weight ratio is 5:1~1:5, preferably 4:1~1:4, preferably 3:1~1:3, more preferably 2:1~1:2, more particularly 1:1.

In the disclosure, there is no limitation for the organic light-emitting material having the thermal activation delayed fluorescence effect as long as its singlet and triplet energy levels and the full width at half maximum of the light-emitting meets the above conditions.

In a preferred embodiment, the organic light-emitting material having the thermal activation delayed fluorescence effect is selected from the following compounds:

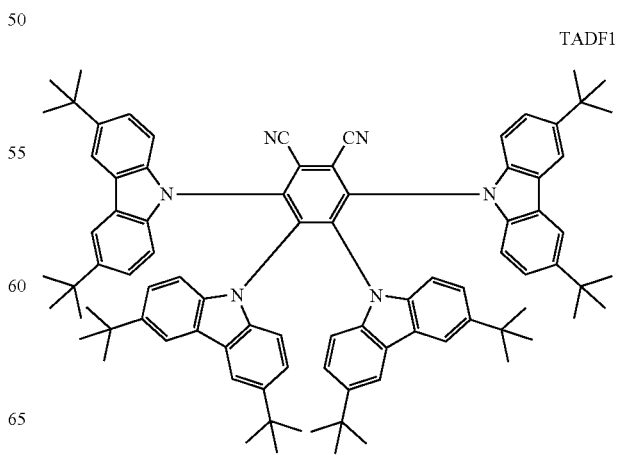

TADF1

-continued

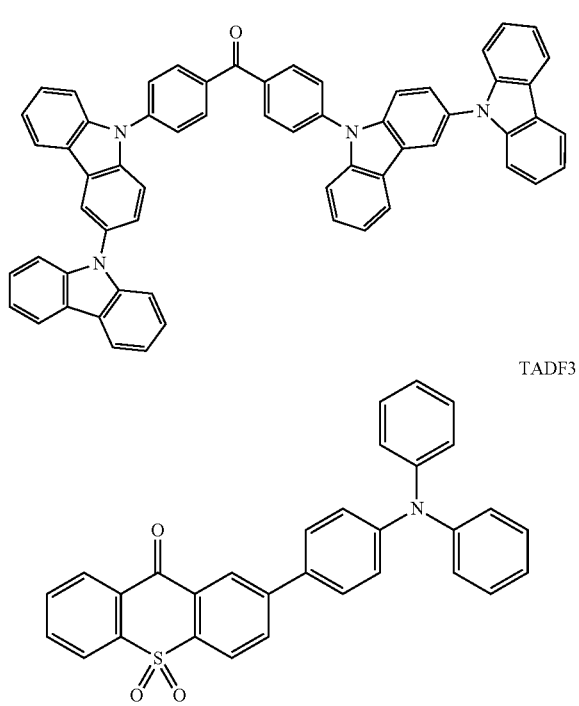

TADF2

TADF3

In a preferred embodiment, the weight ratio of the organic light-emitting material having the thermal activation delayed fluorescence effect relative to the exciplex is 1-20 wt %, preferably 6-18 wt %, more preferably 10-12 wt %, based on the weight of the exciplex.

In another aspect, the disclosure also relates to an organic light-emitting device comprising the organic light-emitting composite material, comprising a first electrode, a second electrode and a functional layer provided between the first electrode and the second electrode, wherein the functional layer comprises a light-emitting layer and optionally comprises a hole injection layer, a hole transport layer, an electron barrier layer and a hole barrier layer, an electron transport layer and an electron injection layer, and the organic light-emitting device also optionally comprises a substrate, wherein, the light-emitting layer is the organic light-emitting composite material of the disclosure as described above.

In one embodiment, the first electrode is an anode, and the second electrode is a cathode.

In addition, in another embodiment, the first electrode is the cathode, and the second electrode is the anode.

Typically, in the organic light-emitting device, electrons are injected from the cathode and transported to the light-emitting layer, and holes are injected from the anode and transported to the light-emitting layer.

In a preferred embodiment, the anode comprises metals, metal oxides or conductive polymers. For example, the range of the work function of the anode has a work function ranging from 3.5 to 5.5 eV. The illustrative examples of the conductive material for the anode include carbon, aluminum, vanadium, chromium, copper, zinc, silver, gold, other metals and alloys thereof; zinc oxide, indium oxide, tin oxide, indium tin oxide (ITO), indium zinc oxide and other similar metal oxides; and oxides and metal mixtures, such as ZnO:Al and $SnO_2$:Sb. The transparent materials and the non-transparent materials are both used as the anode material. For a structure where light is emitted to the anode, the transparent anode can be formed. In this paper, transparency means the pervious degree of light emitted from the organic material layer, and there is no special limitation for light perviousness.

For example, when the organic light-emitting device in this specification is of top light-emitting type and the anode is formed on the substrate before the organic material layer and the cathode are formed, not only transparent materials but also non-transparent materials having excellent light reflection property can be used as anode materials. In another embodiment, when the organic light-emitting device in this specification is of bottom light-emitting type and the anode is formed on the substrate before the organic material layer and the cathode are formed, the transparent material needs to be used as the anode material, or the non-transparent material needs to be formed into a film that is thin enough to be transparent.

In a preferred embodiment, with regard to the cathode, a material having a small work function is preferably selected as the cathode material so that electron injection can be easily performed.

For example, in this specification, a material having a work function ranging from 2 eV to 5 ev can be used as a cathode material. The cathode can comprise metals such as magnesium, calcium, sodium, potassium, titanium, indium, yttrium, lithium, gadolinium, aluminum, silver, tin and lead or their alloys; a material having a multilayer structure such as LiF/Al or $LiO_2$/Al, but is not limited thereto.

The cathode can be formed with the same material as the anode. In this case, the cathode can be formed using the anode material as described above. In addition, the cathode or anode can comprises the transparent material.

According to the used material, the organic light-emitting device of the disclosure can be of top light-emitting type, bottom light-emitting type or two-side light-emitting type.

In a preferred embodiment, the organic light-emitting device of the disclosure comprises a hole injection layer. The hole injection layer can be preferably placed between the anode and the light-emitting layer. The hole injection layer is formed of a hole injection material known to those skilled in the art. The hole injection material is a material which easily receives holes from the anode at low voltage, and the HOMO of the hole injection material is preferably located between the work function of the anode material and the HOMO of the surrounding organic material layer. Specific examples of the hole injection material include but are not limited to metalloporphyrin organic materials, oligothiophene organic materials, aromatic amine organic materials, hexanitrile hexaazabenzopheanthrene organic materials, quinacridone organic materials, perylene organic materials, anthraquinone conductive polymers, polyaniline conductive polymers or polythiophene conductive polymers.

In a preferred embodiment, the organic light-emitting device of the disclosure comprises a hole transport layer. The hole transport layer can be preferably placed between the hole injection layer and the light-emitting layer or between the anode and the light-emitting layer. The hole transport layer is formed of a hole transport material known to those skilled in the art. The hole transport material is preferably a material having a high hole mobility, which is capable of transferring holes from the anode or the hole injection layer to the light-emitting layer. Specific examples of the hole transport material include but are not limited to aromatic amine organic materials, conductive polymers, and block copolymers having joint parts and non-joint parts.

In a preferred embodiment, the organic light-emitting device of the disclosure also comprises an electronic barrier layer. The electronic barrier layer can be preferably placed between the hole transport layer and the light-emitting layer or between the hole injection layer and the light-emitting layer or between the anode and the light-emitting layer. The electron barrier layer is formed of an electron barrier material, such as TCTA, known to those skilled in the art.

In a preferred embodiment, the organic light-emitting device of the disclosure comprises an electron injection layer. The electron injection layer can be preferably placed between the cathode and the light-emitting layer. The electron injection layer is formed of an electron injection material known to those skilled in the art. The electron injection layer can be formed using for example an electron receiving organic compound. Here, as the electron receiving organic compounds, known optional compounds can be used without special limitation. As such organic compounds, polycyclic compounds, such as p-terphenyls or quaterphenyls or derivatives thereof; polycyclic hydrocarbon compounds, such as naphthalene, naphthacene, perylene, hexabenzobenzene, chrysene anthracene, diphenylanthracene or phenanthrene, or derivatives thereof; or heterocyclic compounds, such as phenanthroline, bathophenanthroline, phenanthridine, acridine, quinoline, quinoxaline or phenazine, or derivatives thereof can be used. The electron injection layer can also be formed using inorganic materials including but not limited to for example magnesium, calcium, sodium, potassium, titanium, indium, yttrium, lithium, gadolinium, aluminum, silver, tin and lead or alloys thereof; $LiF$, $LiO_2$, $LiCoO_2$, $NaCl$, $MgF_2$, $CsF$, $CaF_2$, $BaF_2$, $NaF$, $RbF$, $CsCl$, $Ru_2CO_3$ and $YbF3$; and materials having multilayer structures, such as $LiF/Al$ or $LiO_2/Al$.

In a preferred embodiment, the organic light-emitting device of the disclosure comprises an electron transport layer. The electron transport layer can be preferably placed between the electron injection layer and the light-emitting layer or between the cathode and the light-emitting layer. The electron transport layer is formed of an electron transport material known to those skilled in the art. The electron transport material is a material which can easily receive electrons from the cathode and transfer the received electrons to the light-emitting layer. Materials having high electron mobility are preferred. Specific examples of the electronic transport material include but are not limited to 8-hydroxyquinoline aluminum complexes; composites containing $Alq_3$; organic free radical compounds; and hydroxyflavone metal complexes; and TPBi.

In a preferred embodiment, the organic light-emitting device of the disclosure also comprises a hole barrier layer. The hole barrier layer can be preferably placed between the electron transport layer and the light-emitting layer or between the electron injection layer and the light-emitting layer or between the cathode and the light-emitting layer. The hole barrier layer is a layer that is capable of preventing the injected holes from penetrating through the light-emitting layer to reach the cathode, and can be generally formed under the same conditions as the hole injection layer. Specific examples include oxadiazole derivatives, triazole derivatives, phenanthroline derivatives, BCP, aluminum composites, but are not limited thereto.

In a preferred embodiment, the hole barrier layer and the electron transport layer can be identical.

In addition, according to one embodiment of this specification, the organic light-emitting device can also include a substrate. Particularly, in the organic light-emitting device, the first electrode or the second electrode can be provided on the substrate. There are no special limitation for the substrate. The substrate is a rigid substrate such as a glass substrate, and can also be a flexible substrate such as a flexible film-shaped glass substrate, a plastic substrate or a film-shaped substrate.

The organic light-emitting device of the disclosure can be produced using the same materials and methods known in the art. For example, the organic light-emitting device of the disclosure can be manufactured by sequentially depositing the first electrode, one or more organic material layers and the second electrode on the substrate. In particular, the organic light-emitting device can be produced by the following steps: depositing metals, conductive metal oxides or alloys thereof on the substrate using a physical vapor deposition (PVD) method (such as sputtering or electron beam evaporation) to form the anode; and forming the organic material layer including the hole injection layer, the hole transport layer, the electron barrier layer, the light-emitting layer and the electron transport layer on the anode; and subsequently depositing a material which can be used for forming the cathode on the organic material layer. In addition, the organic light-emitting device can be manufactured by sequentially depositing a cathode material, one or more organic material layers and an anode material on the substrate. In addition, during the manufacturing of the organic light-emitting device, the organic light-emitting composite material of the disclosure can be made into the organic material layer by using a solution coating method except the physical vapor deposition method. As used in this specification, the term "solution coating method" refers to rotary coating, dip coating, scraper coating, ink-jet printing, screen printing, spraying, roll coating and the like, but is not limited thereto.

The thickness of each layer has no specific limitation, and can be determined by those skilled in the art according to needs and specific situations.

In a preferred embodiment, the thicknesses of the light-emitting layer as well as optionally the hole injection layer, the hole transport layer, the electron barrier layer, the electron transport layer and the electron injection layer are respectively 0.5~150 nm, preferably 1~100 nm.

In a preferred embodiment, the thickness of the light-emitting layer is 20~80 nm, preferably 30~60 nm.

The organic light-emitting device comprising the organic light-emitting composite material of the disclosure has the advantages of higher device efficiency, lower device voltage, high color purity and long service life.

In addition, in still another aspect, the disclosure also relates to use of the organic light-emitting composite material of the disclosure as described above for organic electron devices such as organic light-emitting devices and organic solar batteries.

EXAMPLES

The disclosure will be described in more detail below with reference to preparation examples, however, the scope of the disclosure is not limited by these preparation examples.

Various materials used in examples and comparative examples are all commercially available or can be obtained by methods known to those skilled in the art.

The molecular structure formulas of relevant materials are as follows:
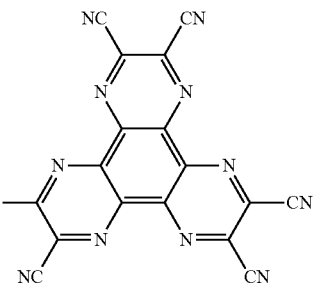
HATCN
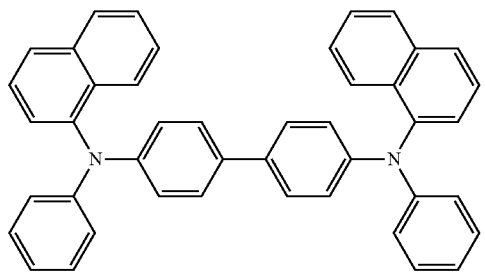
NPB
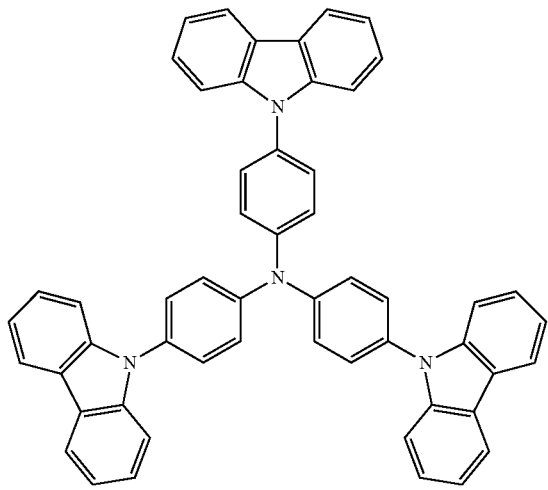
TCTA
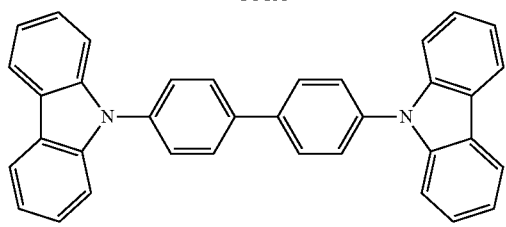
CBP
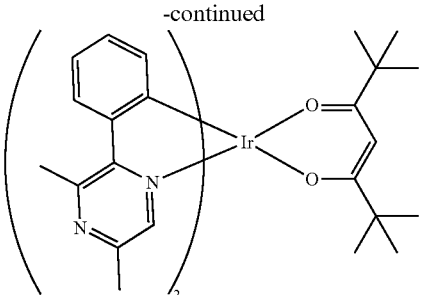
YD-1
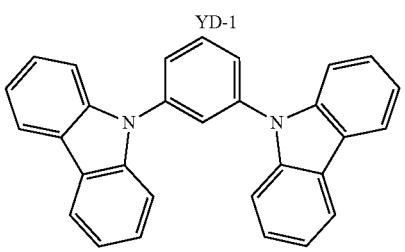
mCP
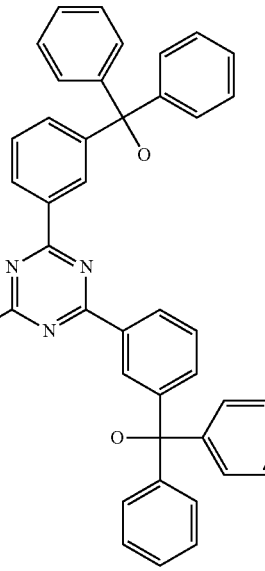
PO-T2T
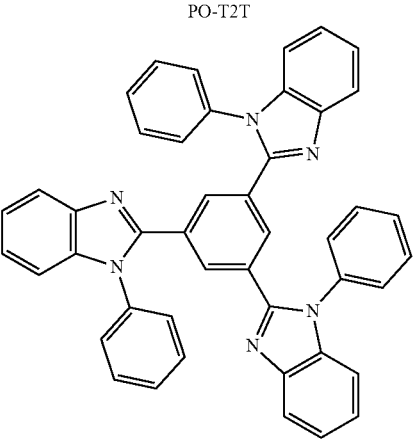
TPBi

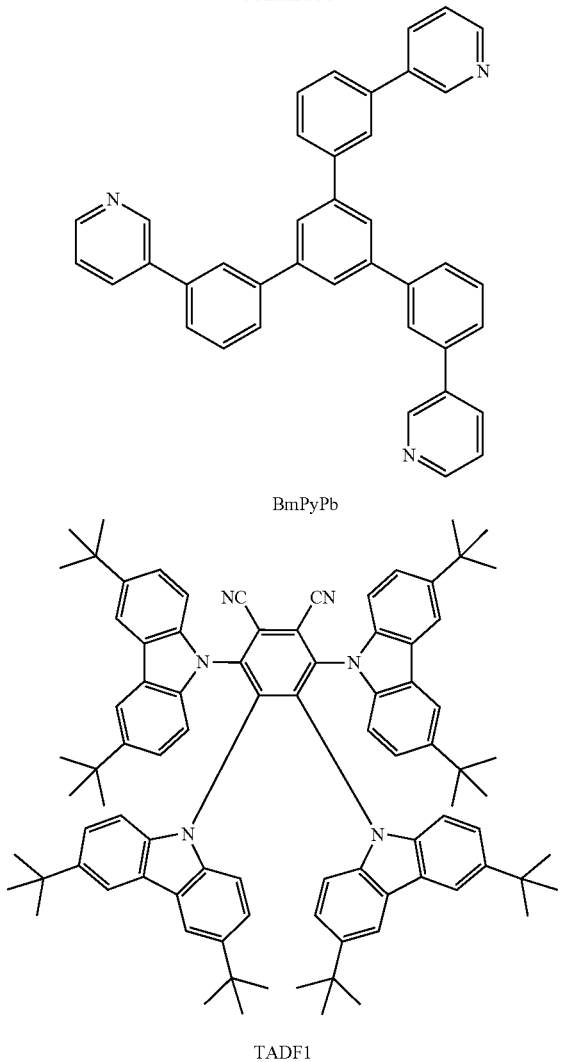

BmPyPb

TADF1

Wherein, energy level relationships among various substances are as follows:

mCP: 6.1 eV for HOMO, 2.4 eV for LUMO, 3.47 eV for $S_1$, and 2.90 eV for $T_1$;

PO-T2T: 6.98 eV for HOMO, 3.22 eV for HOMO, 3.51 eV for $S_1$, and 2.96 eV for $T_1$;

TCTA: 5.8 eV for HOMO, 2.4 eV for LUMO, 3.12 eV for $S_1$ and 2.78 eV for $T_1$;

BmPyPb: 6.4 eV for HOMO, 2.7 eV for LUMO, 3.45 eV for $S_1$, and 2.70 eV for $T_1$;

TADF1: 5.6 eV for HOMO, 3.2 eV for LUMO, 2.26 eV for $S_1$ and 2.13 eV for $T_1$;

The full width at half maximum of light-emitting of TADF1 is about 60 nm;

The energy levels of two specific exciplex host materials are measured as follows:

|  | $S_1$ (eV) | $T_1$ (eV) | $\Delta E_{st}$ (eV) |
| --- | --- | --- | --- |
| mCP: PO-T2T | 2.698 | 2.688 | 0.01 |
| TCTA: BmPyPb | 2.72 | 2.69 | 0.03 |

Measurement method: the mixed single film of the above materials was prepared in a vacuum evaporation chamber, and then the normal temperature PL spectrum and the low temperature PL spectrum of the above single film were respectively measured. Through irradiation of the surface of a sample, it was detected in the normal temperature PL spectrum that the emergent light of the laser source of 325 nm obtained excitation spectrum peak wavelength. By cooling the sample to 35K and irradiating the surface of the sample with the laser source of 325 nm, it was detected in the low temperature PL spectrum that the emergent light of the laser source of 325 nm obtained excitation spectrum peak wavelength. Then, $S_1$ and $T_1$ were calculated by formula $E=1240/\lambda$ to obtain the value of $\phi E_{ST}$.

Comparative Example 1

The device structure is as shown in FIG. 1. The specific preparation process of the device is as follows:

The ITO anode layer 2 on the transparent glass substrate layer 1 was washed respectively with deionized water, acetone and ethanol for each 15 min under the ultrasonic condition, and then treated in a plasma washing machine for 2 min; after being dried, the ITO glass substrate was placed in a vacuum cavity, and then HATCN having a film thickness of 10 nm was evaporated on the ITO anode layer 2 when the vacuum degree was less than $2*10^{-6}$ Torr, and this layer was the hole injection layer 3; subsequently, NPB having a thickness of 50 nm was evaporated, and this layer was used as the hole transport layer 4; then TCTA having a thickness of 10 nm was evaporated, and this layer was used as the electron-blocking layer 5; further, the light-emitting layer 6 having a thickness of 40 nm was evaporated: wherein, rate control was conducted through a film thickness gauge according to the mass percentages of the host material and the dopant material by using the CBP as the host material and the YD-1 as green light-phosphorescence dopant dye; TPBi having a thickness of 45 nm was further evaporated on the light-emitting layer 6, and this organic material layer was used as the hole blocking/electron transporting layer 7; LiF having a thickness of 1 nm was evaporated in vacuum on the hole barrier/electron transport layer 7, and this layer was the electron injection layer 8; cathode Al (100 nm) was evaporated in vacuum on the electron injection layer 8, and this layer was the cathode electrode layer 9.

The IVL data and light brightness decay lifetime of the device are measured, and results are as shown in Table 2, wherein the external quantum efficiency is tested by an integrating sphere (L5000) test system, and the service life of LT90 is measured by an OLED life tester (M6000).

Comparative Examples 2-5

After the manufacturing of the electroluminescent device is completed according to the same method as that in comparative example 1, the IVL data and light brightness decay lifetime of the device are measured, and results are as shown in Table 2. Different from comparative example 1, the concentrations of various functional layer materials and the dopant materials in examples are changed.

It can be seen from the data in the table that by comparing comparative examples 4-5 with comparative examples 1-3, the above two materials are used and matched to form the exciplex as the host material, and the traditional phosphorescence material is used as the guest material, and the device efficiency is significantly improved compared with the traditional host material. It is speculated that the reason is that singlet and triplet energy levels of the traditional host material are quite different, and the energy conduction efficiency between the host and guest materials is relatively low, leading to reduction in device efficiency; relative to the single host material, the energy levels of the exciplex host are redistributed, the singlet and triplet energy levels are relatively close, and the triplet energy level is reduced, the energy between the host and the guest is more sufficiently transferred, and the device efficiency is correspondingly improved. Meanwhile, since the host material is composed of donor and acceptor materials, carriers are directly injected to the HOMO of the donor and the LUMO of the acceptor when in injection without a need of being injected to the HOMO and LUMO of the host like the traditional host material, in such a way, the carriers are easily injected, and the device voltage is lower.

Comparative Examples 6-8

Organic electroluminescent devices containing different host materials doped with thermal activation delayed fluorescent materials were manufactured by the same method as that in comparative example 1. The device structure is as shown in FIG. 1. The structure and performance of the device are as shown in Table 1 and Table 2.

Examples 1-6

Organic electroluminescent devices comprising different host materials doped with thermal activation delayed fluorescent materials were manufactured by the same method as that in comparative example 1. The device structure is as shown in FIG. 1. The structure and performance of the device are as shown in Table 1 and Table 2.

From the data in the tables, it can be seen that by comparing examples 1-6 with comparative examples 1-8, the above two materials are used and matched to form the exciplex as the host material, and the thermal activation delayed fluorescent material is used as the guest, so the device efficiency is significantly improved compared with that of the traditional host material. It is speculated that the main reason is that the energy levels are redistributed when the electron donor and the electron acceptor form the host material of the exciplex, and the exciplex typically has a narrow band gap while ensuring the energy between the host and the guest can be effectively transferred relative to the traditional host material, so that small injection barriers are formed among the exciplex as well as the hole transport layers and the electron transport layers at two sides thereof, which can reduce the threshold voltage of the device. Next, the distance between the singlet state and the triplet state can be effectively narrowed by using the inter-molecular CT state through the host material of the exciplex consisting of the electron donor materials and electron acceptor materials, thereby realizing inverse intersystem crossing of the host material from the triplet state to the singlet state. At the same time, the thermal activation delayed fluorescent material can be used as the guest material, thereby realizing 100% energy transfer from the host material to the guest material and obtaining high-efficiency and high-color purity organic electroluminescent devices. Moreover, the exciplexes can easily achieve the characteristics of balancing carrier transport, reduces exciton quenching effect, and effectively improves the efficiency and service life of the device. Further, by adjusting the doping concentrations of the host and the guest, it is found that the optimal doping mass proportion of guest doping is about 12%. When the doping concentration is low, the energy transfer between the host and the guest may not be sufficient, which leads to a fact that the energy can not be fully utilized; when the doping concentration is too high, the aggregation of molecules is easily caused to generate triplet-triplet quenching, so as to influence the efficiency and service life of the device.

It can also be seen from the data in the table that by comparing examples 1-6 with comparative examples 4-5, the organic electroluminescent device prepared by using the exciplex as the host material and using thermal activation delayed fluorescent dye as the light-emitting material has better device efficiency and longer device service life compared with the device prepared by the traditional phosphorescent material. The main reason is that there are heavy metal ions in the traditional phosphorescent material, which is prone to causing molecular aggregation and generate the exciton quenching effect, so the device efficiency is attenuated rapidly and the service life of the device is relatively low.

TABLE 1

| Number | Substrate | anode | Hole injection layer | Hole transport layer | Electron barrier layer | Light-emitting layer | Electron transport layer | Electron injection layer | Cathode |
|---|---|---|---|---|---|---|---|---|---|
| Comparative example 1 | Glass | ITO | HAT-CN (10 nm) | NPB (50 nm) | TCTA (10 nm) | CBP:YD-1 = 100:6 (40 nm) | TPBi (45 nm) | LiF (1 nm) | Al (100 nm) |
| Comparative example 2 | Glass | ITO | HAT-CN (10 nm) | NPB (50 nm) | TCTA (10 nm) | mCP:YD-1 = 100:6 (40 nm) | TPBi (45 nm) | LiF (1 nm) | Al (100 nm) |
| Comparative example 3 | Glass | ITO | HAT-CN (10 nm) | NPB (50 nm) | TCTA (10 nm) | PO-T2T:YD-1 = 100:6 (40 nm) | TPBi (45 nm) | LiF (1 nm) | Al (100 nm) |
| Comparative example 4 | Glass | ITO | HAT-CN (10 nm) | NPB (50 nm) | TCTA (10 nm) | mCP:PO-T2T: YD-1 = 50:50:6 (40 nm) | TPBi (45 nm) | LiF (1 nm) | Al (100 nm) |
| Comparative example 5 | Glass | ITO | HAT-CN (10 nm) | NPB (50 nm) | TCTA (10 nm) | TCTA:BmPyPb: YD-1 = 50:50:6 (40 nm) | TPBi (45 nm) | LiF (1 nm) | Al (100 nm) |
| Comparative example 6 | Glass | ITO | HAT-CN (10 nm) | NPB (50 nm) | TCTA (10 nm) | CBP:TADF1 = 100:6 (40 nm) | TPBi (45 nm) | LiF (11 nm) | Al (100 nm) |
| Comparative example 7 | Glass | ITO | HAT-CN (10 nm) | NPB (50 nm) | TCTA (10 nm) | mCP:TADF1 = 100:6 (40 nm) | TPBi (45 nm) | LiF (1 nm) | Al (100 nm) |

TABLE 1-continued

| Number | Substrate | anode | Hole injection layer | Hole transport layer | Electron barrier layer | Light-emitting layer | Electron transport layer | Electron injection layer | Cathode |
|---|---|---|---|---|---|---|---|---|---|
| Comparative example 8 | Glass | ITO | HAT-CN (10 nm) | NPB (50 nm) | TCTA (10 nm) | PO-T2T:TADF1 = 100:6 (40 nm) | TPBi (45 nm) | LiF (1 nm) | Al (100 nm) |
| Example 1 | Glass | ITO | HAT-CN (10 nm) | NPB (50 nm) | TCTA (10 nm) | mCP:PO-T2T:TADF1 = 50:50:6 (40 nm) | TPBi (45 nm) | LiF (1 nm) | Al (100 nm) |
| Example 2 | Glass | ITO | HAT-CN (10 nm) | NPB (50 nm) | TCTA (10 nm) | mCP:PO-T2T:TADF1 = 50:50:12 (40 nm) | TPBi (45 nm) | LiF (1 nm) | Al (100 nm) |
| Example 3 | Glass | ITO | HAT-CN (10 nm) | NPB (50 nm) | TCTA (10 nm) | mCP:PO-T2T:TADF1 = 50:50:18 (40 nm) | TPBi (45 nm) | LiF (1 nm) | Al (100 nm) |
| Example 4 | Glass | ITO | HAT-CN (10 nm) | NPB (50 nm) | TCTA (10 nm) | TCTA:BmPyPb:TADF1 = 50:50:6 (40 nm) | TPBi (45 nm) | LiF (1 nm) | Al (100 nm) |
| Example 5 | Glass | ITO | HAT-CN (10 nm) | NPB (50 nm) | TCTA (10 nm) | TCTA:BmPyPb:TADF1 = 50:50:12 (40 nm) | TPBi (45 nm) | LiF (1 nm) | Al (100 nm) |
| Example 6 | Glass | ITO | HAT-CN (10 nm) | NPB (50 nm) | TCTA (10 nm) | TCTA:BmPyPb:TADF1 = 50:50:18 (40 nm) | TPBi (45 nm) | LiF (1 nm) | Al (100 nm) |

TABLE 2

| Device code | Voltage (V @ 10 mA/cm$^2$) | External quantum efficiency (10 mA/cm$^2$) | Half peak width of device spectrum (nm) | Color coordinates | Maximum external quantum efficiency | LT90 service life (h) |
|---|---|---|---|---|---|---|
| Comparative example 1 | 3.42 | 11% | 98 | 0.56, 0.44 | 17% | 90 |
| Comparative example 2 | 3.41 | 12% | 82 | 0.55, 0.44 | 18% | 87 |
| Comparative example 3 | 3.39 | 11% | 85 | 0.55, 0.44 | 17% | 89 |
| Comparative example 4 | 3.02 | 20% | 58 | 0.54, 0.46 | 21% | 195 |
| Comparative example 5 | 3.08 | 18% | 62 | 0.54, 0.46 | 22% | 192 |
| Comparative example 6 | 3.39 | 14% | 98 | 0.56, 0.44 | 21% | 98 |
| Comparative example 7 | 3.38 | 14% | 82 | 0.55, 0.44 | 19% | 96 |
| Comparative example 8 | 3.41 | 12% | 85 | 0.55, 0.44 | 18% | 90 |
| Example 1 | 3.12 | 22% | 56 | 0.54, 0.46 | 25% | 196 |
| Example 2 | 3.02 | 23% | 58 | 0.54, 0.46 | 26% | 210 |
| Example 3 | 3.06 | 21% | 56 | 0.54, 0.46 | 24% | 186 |
| Example 4 | 3.08 | 24% | 62 | 0.55, 0.45 | 26% | 192 |
| Example 5 | 3.04 | 24% | 61 | 0.54, 0.45 | 26% | 206 |
| Example 6 | 3.01 | 22% | 64 | 0.55, 0.45 | 24% | 196 |

We claim:

1. An organic light-emitting composite material, comprising a host material and a dopant material, the host material being an exciplex formed by mixing at least one electron donor material and at least one electron acceptor material, the dopant material being at least one organic light-emitting material having a thermal activation delayed fluorescence effect, wherein, the absolute value of the HOMO energy level of the electron donor material constituting the exciplex is less than the absolute value of the HOMO energy level of the electron acceptor material, and the difference range is more than 0.3 eV, the absolute value of the LUMO energy level of the electron donor material constituting the exciplex is less than the absolute value of the LUMO energy level of the electron acceptor material, and the difference range is more than 0.3 eV, the singlet and triplet energy levels of the electron donor material and the electron acceptor material which constitute the exciplex are both higher than the singlet energy level of the organic light-emitting material having the thermal activation delayed fluorescence effect, and the difference is no less than 0.2 eV, the difference between the singlet energy level and the triplet energy level of the host material of the exciplex is no more than 0.15 eV, the triplet energy level of the host material of the exciplex is more than that of the organic light-emitting material having the thermal activation delayed fluorescence effect, and the difference range is 0.1 eV or more, and the difference between singlet and triplet energy levels of the organic light-emitting material having the thermal activation delayed fluorescence effect is no more than 0.2 eV, and the full width at half maximum of light-emitting is no more than 120 nm.

2. The organic light-emitting composite material according to claim 1, wherein the electron donor material and the electron acceptor material which constitute the exciplex are selected from carbazole derivatives, triarylamine derivatives, fluorene Derivatives, spirofluorene derivatives, triazine derivatives, nitrogen-containing heterocyclic derivatives and xanthone derivatives; preferably, mCP, TPBi, TCTA, BmPyPb, NPB, PO-T2T, B3PYMPM and TAPC.

3. The organic light-emitting composite material according to claim 1, wherein the electron donor material constituting the exciplex is selected from mCP and TCTA.

4. The organic light-emitting composite material according to claim 1, wherein the electron acceptor material constituting the exciplex is selected from PO-T2T and BmPyPb.

5. The organic light-emitting composite material according to claim 1, wherein the weight ratio of the electron donor material to the electron acceptor material is from 5:1 to 1:5.

6. The organic light-emitting composite material according to claim 1, wherein the organic light-emitting material having the thermal activation delayed fluorescence effect is selected from the following compounds:

TADF1

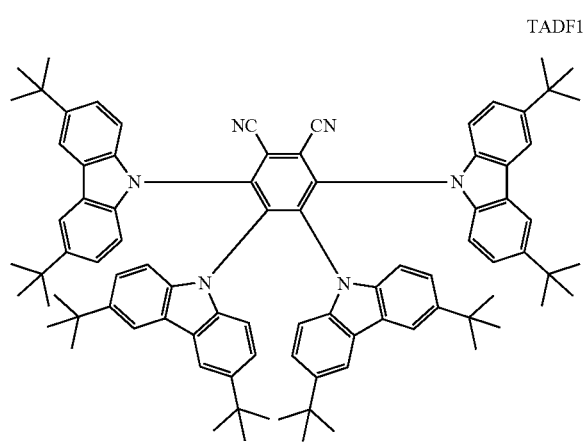

TADF2

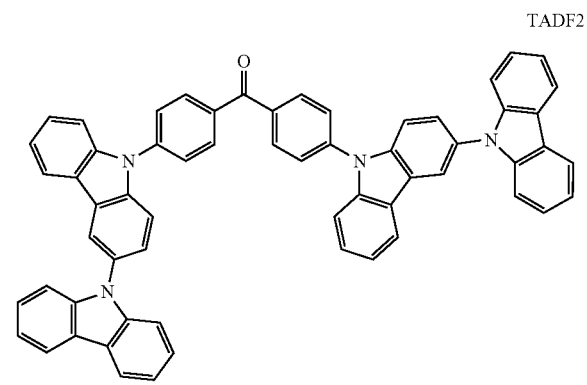

TADF

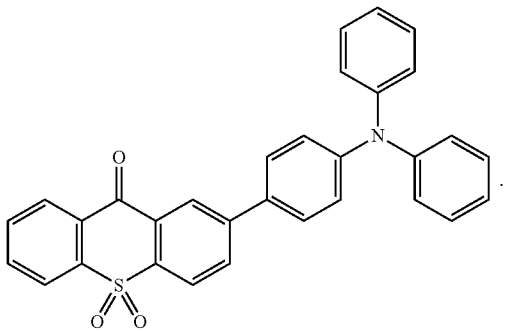

7. The organic light-emitting composite material according to claim 1, wherein the weight ratio of the organic light-emitting material having the thermal activation delayed fluorescence effect relative to the exciplex is 1-20 wt %, based on the weight of the exciplex.

8. An organic light-emitting device comprising the organic light-emitting composite material according to claim 1, comprising a first electrode, a second electrode and a functional layer provided between the first electrode and the second electrode, wherein the functional layer comprises a light-emitting layer and optionally comprises a hole injection layer, a hole transport layer, an electron barrier layer and a hole barrier layer, an electron transport layer and an electron injection layer, and the organic light-emitting device also optionally comprises a substrate,
wherein the light-emitting layer is the organic light-emitting composite material according to claim 1.

9. The organic light-emitting composite material according to claim 1, wherein the first electrode is an anode, and the second electrode is a cathode.

10. The organic light-emitting composite material according to claim 1, wherein the first electrode is the cathode, and the second electrode is the anode.

11. Use of the organic light-emitting composite material according to claim 1 for the organic electron device.

12. The use according to claim 11, wherein the organic electron device is the organic light-emitting device and an organic solar battery.

13. The organic light-emitting composite material according to claim 1, wherein the difference between the triplet energy level of the host material of the exciplex is more than that of the organic light-emitting material having the thermal activation delayed fluorescence effect is no less than 0.2 eV.

14. The organic light-emitting composite material according to claim 1, wherein the difference between singlet and triplet energy levels of the organic light-emitting material having the thermal activation delayed fluorescence effect is no more than 0.15 eV.

15. The organic light-emitting composite material according to claim 1, wherein the full width at half maximum of light-emitting is less than 100 nm.

16. The organic light-emitting composite material according to claim 5, wherein the weight ratio of the electron donor material to the electron acceptor material is from 4:1 to 1:4.

17. The organic light-emitting composite material according to claim 16, wherein the weight ratio of the electron donor material to the electron acceptor material is from 3:1 to 1:3.

18. The organic light-emitting composite material according to claim 17, wherein the weight ratio of the electron donor material to the electron acceptor material is from 2:1 to 1:2.

19. The organic light-emitting composite material according to claim 18, wherein the weight ratio of the electron donor material to the electron acceptor material is 1:1.

20. The organic light-emitting composite material according to claim 7, wherein the weight ratio of the organic light-emitting material having the thermal activation delayed fluorescence effect relative to the exciplex is 10-12 wt %, based on the weight of the exciplex.

* * * * *